United States Patent [19]

Bell

[11] 4,249,138
[45] Feb. 3, 1981

[54] CITIZENS BAND TRANSCEIVER FREQUENCY SYNTHESIZER WITH SINGLE OFFSET AND REFERENCE OSCILLATOR

[75] Inventor: Robert R. Bell, Libertyville, Ill.

[73] Assignee: Motorola, Inc., Schaumburg, Ill.

[21] Appl. No.: 36,727

[22] Filed: May 7, 1979

[51] Int. Cl.$^3$ ............................................... H03B 3/04
[52] U.S. Cl. ..................................... 331/1 A; 455/76; 455/165; 331/18
[58] Field of Search ...................... 331/1 R, 25, 20, 18, 331/1 A; 307/233 R; 455/260, 76, 165, 183

[56] References Cited

U.S. PATENT DOCUMENTS

| | | | |
|---|---|---|---|
| 4,061,973 | 12/1977 | Reiners et al. | 455/76 |
| 4,078,212 | 3/1978 | Rast | 455/183 |
| 4,135,158 | 1/1979 | Parmet | 331/1 A |

Primary Examiner—David K. Moore
Attorney, Agent, or Firm—Phillip H. Melamed; James W. Gillman

[57] ABSTRACT

A frequency synthesizer for a citizens band transceiver is disclosed. The synthesizer utilizes a single master crystal oscillator whose output is coupled to a difference mixer that receives the output of a voltage controlled oscillator (VCO) and provides an input to a programmable frequency divider. This programmable divider provides an output to a phase-frequency comparator which commpares this signal to a reference signal supplied by a fixed divider coupled to the master crystal oscillator. The comparator output, through a low pass filter, controls the voltage controlled oscillator output. The VCO output signal is substantially higher than the maximum frequency capability of the programmable frequency divider, and the present invention by utilizing the master crystal oscillator and difference mixer provides an inexpensive frequency synthesizer utilizing a programmable frequency divider having relatively low maximum input frequency capabilities, and this accomplished without the use of costly multiplier circuits in the frequency synthesizer.

14 Claims, 4 Drawing Figures

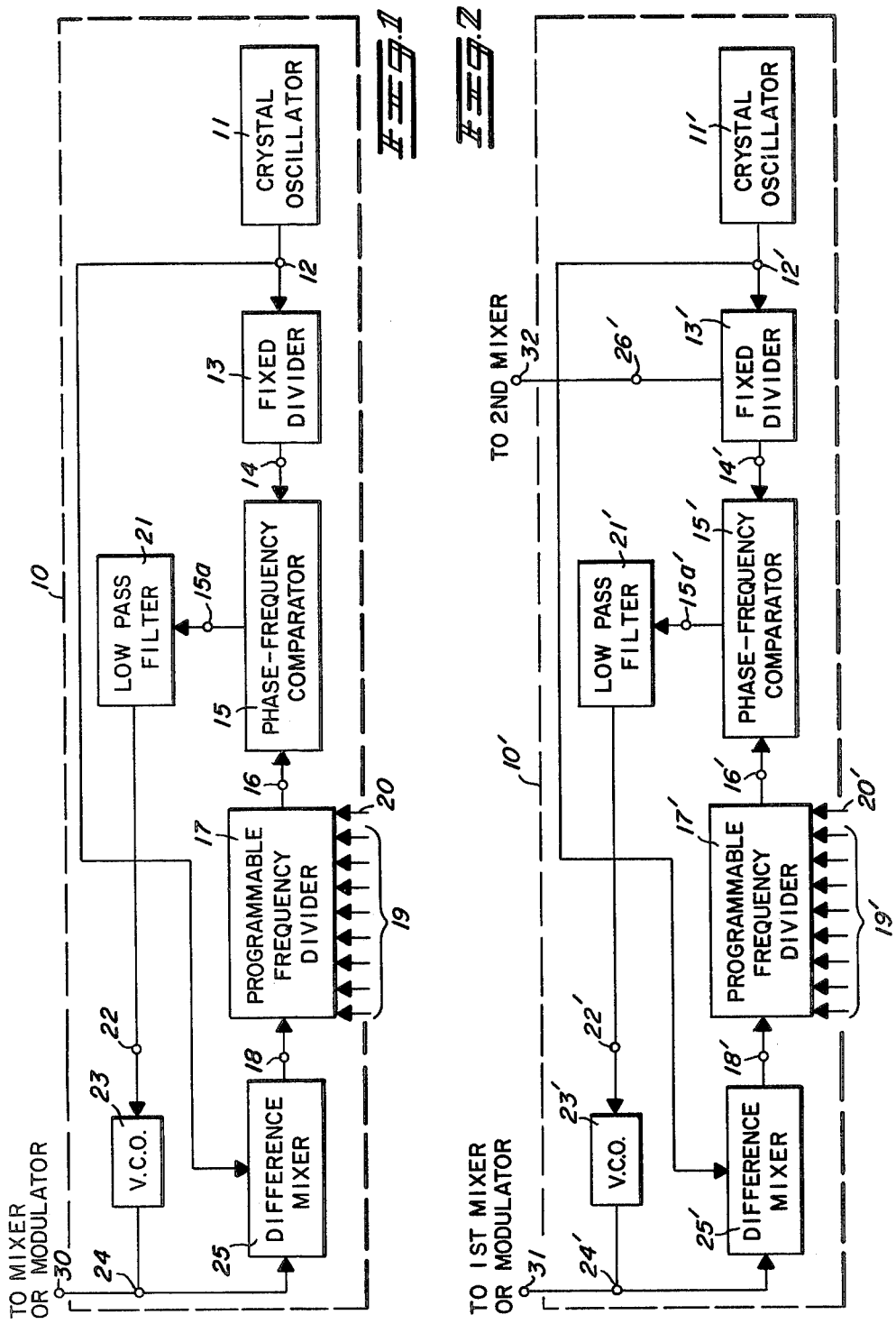

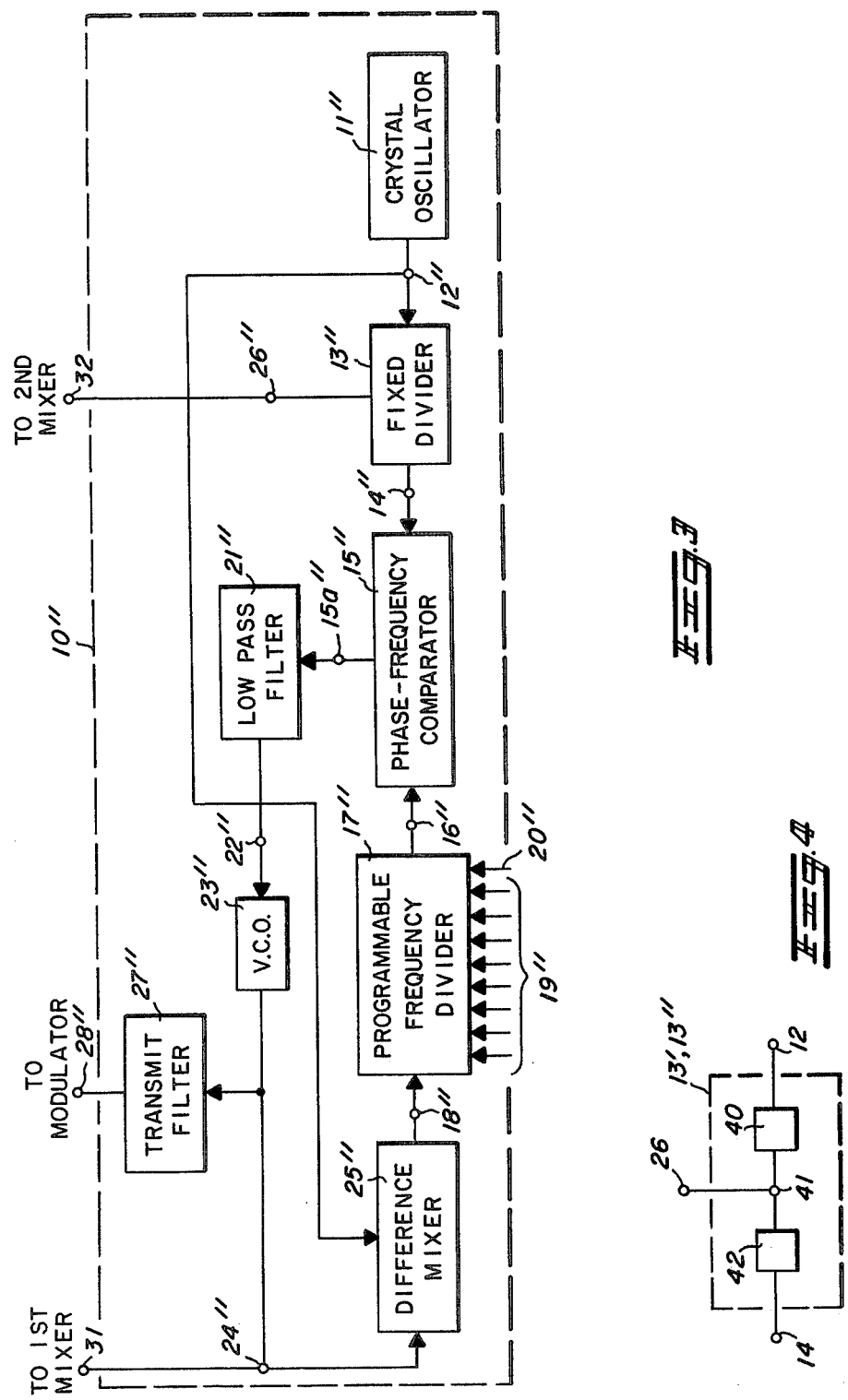

CITIZENS BAND TRANSCEIVER FREQUENCY SYNTHESIZER WITH SINGLE OFFSET AND REFERENCE OSCILLATOR

BACKGROUND OF THE INVENTION

The present invention relates generally to the field of frequency synthesizer circuits, and more particularly to the field of citizens band (CB) transceiver frequency synthesizer circuits in which the synthesizer supplies both the receiver and transmitter injection frequencies for tuning the citizens band transceiver.

A typical radio receiver synthesizer configuration is illustrated in U.S. Pat. No. 4,135,158 owned by the assignee of the present invention. An example of a typical CB transceiver synthesizer configuration is illustrated in U.S. continuation patent application Ser. No. 005,544, filed Jan. 22, 1979, and assigned to the same assignee as the present invention. Both of these prior art synthesizer configurations do not provide for minimizing the cost of the synthesizer while maintaining high performance characteristics. Both of these prior art synthesizers utilize phase-frequency locked loops with voltage controlled oscillators (VCO) and electronically controlled programmable frequency dividers to produce the desired receiver and/or transmitter injection frequencies. In this respect both of the prior art references are similar to the present invention.

The U.S. Pat. No. 4,135,158 contemplates the use of substantially dividing down in frequency the output of the voltage controlled oscillator in order to provide a suitable input for a programmable frequency divider. While this minimizes the cost of the programmable frequency divider by providing a relatively low frequency input to the programmable divider, this requires the use of a relatively expensive fixed divider to divide down the output of the voltage controlled oscillator. The U.S. continuation patent application referred to above avoids the use of this relatively costly fixed divider by utilizing a difference mixer which mixes the output of the voltage controlled oscillator with another high frequency signal to produce a low frequency difference signal that serves as the input to the programmable frequency divider. The continuation application, however, unlike the present invention, utilizes a relatively costly multiplier stage to step up in frequency the output signal of a master crystal oscillator so as to provide a proper high frequency input signal to the difference mixer which also receives the VCO output as an input. The use of this multiplier stage increases the cost of the continuation application synthesizer and also creates undesired spurious signals which will degrade performance for receivers using this synthesizer.

In addition to the two prior art circuits mentioned above, it should be noted that a prior art frequency synthesizers exists (see U.S. Pat. No. 4,061,973) in which one crystal oscillator is used to provide an input signal to the difference mixer for mixing with the VCO output signal while a different crystal oscillator is used as a reference oscillator whose output, after appropriate frequency division, provides a reference signal as an input to a phase-frequency comparator which receives the output of a programmable frequency divider that receives the output of the difference mixer. In this prior art circuit, the cost of the two separate crystal oscillators provides a distinct cost disadvantage for this configuration, and the fact that two separate oscillators are used leads to synthesizer stability problems since the oscillators have the potential for varying in frequency and phase in different manners.

SUMMARY OF THE INVENTION

An object of the present invention is to provide a frequency synthesizer with a single offset and reference oscillator in which the cost of the synthesizer is minimized and the disadvantages of the prior art synthesizers discussed above are overcome.

In one embodiment of the present invention, a receiver frequency synthesizer with a single offset and reference oscillator is provided. The synthesizer comprises an electronically controllable frequency divider means which has a maximum input frequency $F_{inmax}$ at which it can operate at, said frequency divider means receiving an input signal at a frequency $F_{in}$ less than $F_{inmax}$ and producing an output signal which has a frequency corresponding to the frequency of the input signal $F_{in}$ divided by a predetermined integer, the frequency divider means receiving electrical control signals which determine the predetermined integer; master crystal oscillator means producing an output signal having a stable operative frequency $F_{xtal}$ which is substantially above the frequency $F_{in}$; voltage controlled oscillator (VCO) means providing an output signal having a frequency $F_{vco}$ substantially above the frequency $F_{in}$; difference mixer means coupled to said VCO means for receiving a signal therefrom having a frequency no more than $F_{vco}$, and coupled to said crystal oscillator means for receiving a signal therefrom having a frequency no more than the frequency $F_{xtal}$, said mixer means providing at an output a signal having a frequency equal to the difference of the frequencies of the received signals, said mixer output coupled to said controllable divider means with said divider means receiving a signal having a frequency $F_{in}$ less than the frequency $F_{inmax}$ and no more than the frequency of the output signal of said mixer means; said VCO means, difference mixer means and controllable divider means being part of a phase-frequency locked loop; phase-frequency comparator means also being included in said phase-frequency locked loop and receiving an input from the output of the controllable divider means; fixed divider means coupled to said master crystal oscillator for providing a signal having a frequency substantially less than $F_{xtal}$ as another input to said phase-frequency comparator means from said master crystal oscillator means; said phase-frequency comparator means providing a difference output signal related to the phase-frequency difference between the output signal of the controllable divider means and the output signal of the fixed divider means; and low pass filter means which is part of said phase-frequency locked loop and receives said phase-frequency difference output signal and supplies a DC control input signal to said VCO means in response thereto, wherein said VCO output signal, in accordance with said controllable divider means receiving appropriate electrical control signals, determines at least a receiver injection frequency signal for a receiver, whereby only a single stable oscillator is required by the frequency synthesizer, no frequency multiplication stages in the phase-frequency locked loop are required, and an inexpensive controllable frequency divider means operable at a relatively low maximum frequency of $F_{inmax}$ can be used.

Preferably, the frequency synthesizer is utilized in a CB transceiver and the master crystal oscillator, VCO, difference mixer and programmable frequency divider have direct connections therebetween for coupling the signals recited above. In this manner, the cost of the synthesizer is minimized since no frequency multiplier stages are required for the phase-frequency locked loop portion of the circuitry and the performance of the synthesizer is maximized by the use of only a single master crystal oscillator and by not utilizing frequency multipliers which may generate spurious signals. The present invention minimizes the synthesizer cost by enabling the use of a programmable frequency divider having a relatively low maximum frequency input signal capability since the cost of such dividers is directly related to the maximum input frequency which the divider must handle.

Several embodiments of the present invention are illustrated which show how the invention can be utilized in a CB transceiver utilizing single or double frequency conversion for its receiver processing circuitry, and the embodiments illustrate utilizing the output of the VCO directly as an input to a CB modulator or deriving a signal related to twice the frequency of the VCO output and utilizing this signal as the input to the CB modulator.

BRIEF DESCRIPTION OF THE DRAWINGS

For a more complete understanding of the present invention reference should be made to the drawings in which:

FIG. 1 is a block diagram of a frequency synthesizer usable for a single conversion citizens band (CB) transceiver;

FIG. 2 is a block diagram of a frequency synthesizer usable for a double frequency conversion CB synthesizer;

FIG. 3 is a block diagram of another frequency synthesizer usable for a double conversion CB transceiver; and FIG. 4 is a block diagram illustrating an embodiment of one of the components in FIGS. 2 and 3.

DESCRIPTION OF THE PREFERRED EMBODIMENTS

Referring to FIG. 1, an embodiment of a frequency synthesizer 10 (shown dashed) for a single frequency conversion CB transceiver is illustrated. The term "single frequency conversion" indicates that the CB transceiver (not shown) utilizes a mixer stage in its receiver front end to produce a single IF frequency signal, according to well known superheterodyne radio tuning principles, and this single IF signal is subsequently demodulated. This is to be contrasted with "double frequency conversion" in which a first IF frequency signal is produced by a mixer stage and subsequently a second IF frequency signal is produced by a subsequent mixer stage with the second IF signal being subsequently demodulated.

The frequency synthesizer 10 illustrated in FIG. 1 provides an output signal at a terminal 30 at a predetermined frequency, and this output signal is selectively utilized either by a mixer stage in a single conversion CB transceiver or by the modulator of a CB transceiver with the signal supplied from the synthesizer serving as the carrier frequency.

The synthesizer 10 basically comprises a phase-frequency locked loop which selectively produces desired receiver and transmitter injection frequency signals for utilization by the transceiver. The term "phase-frequency" refers to the fact that the loop comprises a "phase-frequency" comparator which receives two input signals and produces an output related to the phase and/or frequency difference of the two inputs. Such comparators are well known and will not be discussed in any detail. The term "receiver injection frequency signal" refers to the variable frequency signal used to tune a receiver, and generally this corresponds to the local oscillator signal supplied to a mixer stage of a superheterodyne receiver. The term "transmitter injection frequency signal" refers to the transmitter carrier frequency signal supplied to a transmitter modulator.

The synthesizer 10 basically comprises a single master crystal oscillator 11 which produces a stable output signal at a frequency $F_{xtal}$ at an output terminal 12. The terminal 12 is connected as an input to a fixed frequency divider 13 which essentially provides an output reference frequency signal at a terminal 14 wherein the frequency $F_{ref}$ of the reference signal is substantially less than the frequency $F_{xtal}$ and is equal to the frequency $F_{xtal}$ divided by a predetermined fixed integer which characterizes the frequency division provided by the divider 13. Frequency dividers such as the divider 13 are readily available and well known to those of skill in the art.

The terminal 14 is coupled as an input to a phase-frequency comparator 15 which receives another input from a terminal 16 and produces an output at a terminal 15a. Essentially the phase-frequency comparator 15 compares the phase and/or frequency of the signals present at the terminals 14 and 16 and produces a difference output signal at the terminal 15a related to the phase and/or frequency difference of the two input signals. Such comparators are well known and are commonly used in phase-frequency locked loops. The term "phase-frequency" is utilized to indicate that the comparator 15 is of the type that essentially compares the phase and frequencies of the signals at the terminals 14 and 16. This type of comparator is well known.

A programmable (controllable) frequency divider 17 receives an input signal having a frequency $F_{in}$ at a terminal 18 and produces a corresponding output signal at the terminal 16 which has a frequency equal to the frequency $F_{in}$ of the signal at the terminal 18 divided by a controllable predetermined integer. The frequency divider 17 receives electronic control signals along a plurality of connection lines 19 which determine the integer divisor of the frequency divider 17, and an electronic signal received along a connection line 20 is also indicated wherein the signal on the line 20 indicates to the frequency divider 17 if receiver or transmitter divisors are to be provided by the frequency divider 17 in response to the control signals on the lines 19. Programmable frequency dividers such as divider 17 are well known to those of skill in the art and generally receive binary coded digital logic signals along the connecting lines 19 and 20.

It should be noted that the programmable frequency divider 17 has a maximum operative input frequency $F_{inmax}$ which is the maximum frequency that the divider 17 can receive at the terminal 18 and still properly operate at. The cost of the frequency divider 17 represents one of the largest expenditures for the components in the frequency synthesizer 10, and the cost of the divider is directly related to its maximum operative input frequency $F_{inmax}$, with the cost of the frequency divider 17 being substantially less for lower maximum input frequencies $F_{inmax}$. The present invention enables the use of a programmable frequency divider 17 having a minimum maximum input frequency $F_{inmax}$, and therefore the present invention realizes a substantial cost saving for the frequency divider 17. The manner in which the maximum input frequency $F_{inmax}$ of the divider 17 is minimized by the present invention will be discussed subsequently.

The output terminal 15a of the comparator 15 is coupled as an input to a low pass filter 21 which receives the difference signal at the terminal 15a and supplies a DC control input signal at a terminal 22 as a control input to a voltage controlled oscillator (VCO) 23. The VCO provides an output signal at a frequency $F_{VCO}$ at an output terminal 24 which is directly coupled as an input to a difference mixer 25 that receives another input signal via a direct connection to the terminal 12 and produces an output signal at the terminal 18. The signal produced at the terminal 18 has a frequency equal to the difference of the frequencies of the two input signals received by the difference mixer 25, and this difference frequency corresponds to the input frequency $F_{in}$ of the divider 17.

The terminal 24 is also directly coupled to the output terminal 30 which is selectively coupled to either a front end mixer stage of the receiver portion of a CB transceiver or a modulator stage of the CB transceiver depending upon whether a receive or transmit mode of operation is desired. In this manner the synthesizer 10 selectively supplies a CB transceiver with receiver and transmitter injection frequency signals. Preferably the connection of the output terminal 30 to the mixer or modulator stages is electronically implemented, for example by switching diodes.

Essentially the components 15 through 25 comprise a phase-frequency locked loop wherein the difference output signal produced at the terminal 15a is utilized to control the output of the VCO 23. The difference mixer 25 directly utilizes the output of the VCO 23 and subtracts the output of the crystal oscillator 11 to produce a difference frequency $F_{in}$ at the terminal 18 which is substantially less than either the output frequency $F_{VCO}$ of the VCO 23 or the crystal frequency $F_{xtal}$. In this manner the maximum operative frequency $F_{inmax}$ of the divider 17 is minimized, and the overall cost of the synthesizer 10 is likewise minimized. This configuration also minimizes the number of components in the synthesizer 10 which also reduces the synthesizer cost.

It should be noted that since the frequency $F_{VCO}$ is substantially higher than the maximum input frequency $F_{inmax}$ of the divider 17. This limitation precludes the direct connecting of the VCO signal at the terminal 24 to the frequency divider 17.

It should also be noted that the present invention contemplates the crystal frequency $F_{xtal}$ as being substantially higher than the typical crystal oscillator output frequencies for CB transceivers having similar configurations. One such typical synthesizer is illustrated in copending U.S. patent application No. 005,544, filed Jan. 22, 1979 and assigned to the same assignee as the present invention. The synthesizer in this prior patent application has a crystal oscillator which operates at a relatively low frequency and frequency multiplier stages are required to provide a higher frequency input to the difference mixer in the prior art synthesizer. This is extremely undesirable because this involves not only the additional cost of these frequency multiplier stages, but also frequency multiplying results in generating spurious harmonic signals which will create operational problems for the frequency synthesizer since the spurious signals will also be combined by the mixer with the output signal of the VCO and therefore degrade receiver performance. The present invention overcomes the disadvantage of the prior art synthesizer by providing for a substantially higher frequency of operation for the master crystal oscillator 11. In this manner no frequency multiplier stages are required in the synthesizer of the present invention, and at the same time the input frequency $F_{in}$ at the terminal 18 is minimized such that the frequency divider 17 can have a maximum operative frequency $F_{inmax}$ which is relatively low.

In order to minimize the cost of the synthesizer 10 it is contemplated that the output of the crystal oscillator 11 at the terminal 12 be directly coupled to the difference mixer 25 as an input, and, similarly, that the output of the VCO 23 at the terminal 24 be directly coupled as an input to the mixer 25. It is also contemplated that the output of the difference mixer 25 at the terminal 18 be directly coupled as an input to the frequency divider 17. In this manner a minimum number of parts is utilized for the synthesizer 10 thus providing maximum cost economies for the synthesizer. It should be noted that the present invention contemplates no frequency multiplier stages in the phase-frequency locked loop portion of the circuitry for either of the output signals of the crystal oscillator 11 or the VCO 23. Thus the signals received by the difference mixer 25 from these components will have frequencies that are no more than the respective frequencies of the oscillator 11 or VCO 23.

In order to better understand the present invention the following examples of typical frequencies utilized by the synthesizer 10 for tuning a CB transceiver across the CB frequency band of 26.965 to 27.405 MHz are given. The crystal frequency $F_{xtal}$ is equal to 25.600 MHz, the integer divisor of the fixed divider 13 is 5,120, and the reference frequency $F_{ref}$ at the terminal 14 equals 5 KHz. It is contemplated that the VCO output for a receiver mode of operation will vary from 26.510 to 26.950 MHz, while for transmitter operation the VCO output would vary from 26.965 to 27.405 MHz. In the receiver mode of operation the frequency divider 17 produces divisors 182 through 270, while in the transmit mode the divisors produced are 273 through 361. These divisors result in the input to the frequency divider 17 having frequencies $F_{in}$ from 0.910 through 1.35 MHz in the receiver mode and from 1.365 through 1.805 MHz in the transmit mode. The end result is that for operation at the frequencies stated above, a programmable frequency divider 17 having a maximum input frequency $F_{inmax}$ of 3.5 MHz can be utilized. It should also be noted that for operation at the above frequencies a relatively small spread in the output of the VCO for receiver and transmitter operation is produced, and similarly a relatively small spread in the divisors produced by the programmable divider 17 is produced.

Referring to FIG. 2, a frequency synthesizer 10′ is illustrated comprising components 11′ through 25′ which directly correspond to the components 11 through 25 in FIG. 1 and are identically connected. In FIG. 2, the fixed divider 13′ not only produces an output at the terminal 14′ which serves as an input to the phase-frequency comparator 15′, but also produces an additional output signal at a terminal 26′ which has a frequency $F_{LO2}$ equal to the crystal oscillator frequency $F_{xtal}$ divided by a fixed predetermined integer. The terminal 26′ is directly coupled to a terminal 32 which is an input terminal to a second mixer stage (not shown), while terminal 24' is directly coupled to a terminal 31 which is the input terminal to either a first mixer stage or a modulator stage. Thus the synthesizer 10' in FIG. 2 represents a synthesizer usable with a double conversion CB transceiver having first and second receiver mixers receiving their receiver injection inputs from the terminals 31 and 32 and a modulator stage receiving its transmitter injection input from the terminal 31.

For the synthesizer in FIG. 2, again no multiplier stages are utilized in the phase-frequency locked loop portion of the circuitry, and again the maximum input frequency to the frequency divider 17' is minimized through the use of the difference mixer 25' and its direct connection to the VCO 23' and the output terminal 12' of the master crystal oscillator 11'.

Typical frequencies for tuning the synthesizer 10' over the CB band will now be recited. $F_{xtal}$ equals 25.600 MHz, $F_{ref}$ at terminal 14' equals 5 KHz and the divider 13' between the terminals 12' and 14' provides a fixed frequency division of 5,120. The divider 13' also provides a frequency divided signal at $F_{LO2}$ at the terminal 26' related to the frequency $F_{xtal}$ at the terminal 12' by a predetermined integer. The signal at the terminal 26' is utilized either directly, or through the use of a harmonic filter, to provide a signal for the second mixer stage of the receiver portion of a CB transceiver. Preferably a signal at 5.12 MHz is produced at the terminal 26', and the second harmonic of this signal is generated as the mixing signal for the second mixer. In the transmit mode, the VCO output varies between 26.965 and 27.405 MHz, $F_{in}$ at terminal 18' varies between 1.365 and 1.85 MHz and the divisor of the frequency divider 17' varies between 182 and 270. In the receive mode, $F_{VCO}$ varies between 16.27 and 16.71 MHz, $F_{in}$ varies between 9.33 and 8.89 MHz and the divisor of the frequency divider 17' varies between 1,866 and 1,778. With the above frequencies, a frequency divider 17' having a maximum operative input frequency $F_{inmax}$ of 10 MHz can be utilized.

Referring to FIG. 3, a frequency synthesizer 10" is illustrated having components 11" through 26" which correspond to the components 11' through 26' in FIG. 2 and are identically connected. In addition, the synthesizer 10" in FIG. 3 includes a transmit filter 27" which receives an input from the terminal 24" and produces an output at a terminal 28" that is coupled to a modulator stage of a CB transceiver. The synthesizer 10" also supplies receiver injection frequencies at the terminals 31 and 32 to first and second mixers of a CB transceiver by coupling the terminals 24" and 26" to the terminals 31 and 32, respectively.

Essentially, the synthesizer 10" in FIG. 3 is another embodiment of a double conversion synthesizer similar to that shown in FIG. 2. However, in FIG. 3, the output to the modulator stage of the CB transceiver is obtained from the transmit filter 27". The filter 27" receives the output of the VCO 23" and produces a signal at the terminal 28" having a frequency equal to the second harmonic of the output frequency of the VCO 23". This is accomplished by utilizing resonant circuits in the filter 27" according to well known techniques.

For tuning across the CB band of 26.965 to 27.405 MHz the synthesizer 10" in FIG. 3 has $F_{xtal}$ equal to 15.36 MHz, $F_{ref}$ equal to 2.5 KHz and the frequency divisor of the fixed divider 13' for producing $F_{ref}$ equal to 6,144. In the transmit mode, $F_{VCO}$ ranges from 13.4825 to 13.7025 MHz, $F_{in}$ ranges from 1.8775 to 1.6575 MHz and the divisor of the frequency divider 17" ranges from 751 to 663. In the receive mode, $F_{VCO}$ varies from 16.27 to 16.71 MHz, $F_{in}$ varies from 0.91 to 1.35 MHz and the divisor of frequency divider 17" varies from 364 to 540. Thus for the synthesizer 10" in FIG. 3, a frequency divider 17" having a maximum operable input frequency of 3 MHz can be utilized.

Referring to FIG. 4, a preferred embodiment for the fixed divider 17' or 17" is shown dashed. FIG. 4 illustrates that the divider 17' or 17" preferably comprises a first fixed divider 40 coupled between the terminal 12 and an internal terminal 41 which is directly coupled to the terminal 26. The terminal 41 is directly coupled to the terminal 14 through another fixed divider 42. Thus FIG. 4 illustrates that the fixed frequency divisor implemented by the fixed divider 13' or 13" comprises two fixed dividers serially connected between the terminals 12 and 14 having a junction therebetween providing an interim signal at a frequency $F_{LO2}$ as an output to a second mixer stage. In this manner a minimum number of fixed frequency divisions are utilized to implement the fixed divider 13' or 13" and to provide the second mixer injection frequency at the terminal 32. This is because the serially connected dividers 40 and 42 together produce the signal at $F_{ref}$ at terminal 14, while only divider 40 produces the signal at terminal 26 at $F_{LO2}$.

While I have shown and described specific embodiments of the present invention, further modifications will occur to those of skill in the art. All such modifications which incorporate the basic principles of the present invention described herein and embodied in the attached claims are within the scope of this invention.

I claim:

1. A frequency synthesizer with a single offset and reference oscillator, comprising:

an electronically controllable frequency divider means which has a maximum input frequency $F_{inmax}$ at which it can operate at, said frequency divider means receiving an input signal at a frequency $F_{in}$ less than $F_{inmax}$ and producing an output signal which has a frequency corresponding to the frequency of the input signal $F_{in}$ divided by a predetermined integer, the frequency divider means receiving electrical control signals which determine the predetermined integer;

master crystal oscillator means producing an output signal having a stable operative frequency $F_{xtal}$ which is substantially above the frequency $F_{in}$;

voltage controlled oscillator (VCO) means providing an output signal having a frequency $F_{vco}$ substantially above the frequency $F_{in}$;

difference mixer means coupled to said VCO means for receiving a signal therefrom having a frequency no more than $F_{vco}$, and coupled to said crystal oscillator means for receiving a signal therefrom having a frequency no more than the frequency $F_{xtal}$, said mixer means providing at an output a signal having a frequency equal to the difference of the frequencies of the received signals, said mixer output coupled to said controllable divider means with said divider means receiving a signal having a frequency $F_{in}$ less than the frequency $F_{inmax}$ and no more than the frequency of the output signal of said mixer means;

said VCO means, difference mixer means and controllable divider means being part of a phase-frequency locked loop;

phase-frequency comparator means also being included in said phase-frequency locked loop and receiving an input from the output of the controllable divider means;

fixed divider means coupled to said master crystal oscillator for providing a signal having a frequency substantially less than $F_{xtal}$ as another input to said phase-frequency comparator means from said master crystal oscillator means;

said phase-frequency comparator means providing a difference output signal related to the phase-frequency difference between the output signal of the controllable divider means and the output signal of the fixed divider means; and low pass filter means which is part of said phase-frequency locked loop and receives said phase-frequency difference output signal and supplies a DC control input signal to said VCO means in response thereto, wherein said VCO output signal is determined in accordance with said controllable divider means receiving appropriate electrical control signals, whereby only a single stable oscillator is required by the frequency synthesizer, no frequency multiplication stages in the phase-frequency locked loop are required, and an inexpensive controllable frequency divider means operable at a relatively low maximum frequency $F_{inmax}$ can be used.

2. A frequency synthesizer according to claim 1 wherein said VCO output signal is directly coupled as an input to said difference mixer means.

3. A frequency synthesizer according to claim 2 wherein said master oscillator output signal is directly coupled as an input to said difference mixer means.

4. A frequency synthesizer according to claim 3 wherein the output signal of said difference mixer means is directly coupled as an input to said controllable frequency divider means.

5. A frequency synthesizer according to claim 4 wherein said VCO output determines the receiver injection frequency of a radio receiver.

6. A frequency synthesizer according to claim 5 wherein said fixed divider means provides an additional output signal at a frequency equal to $F_{xtal}$ divided by a predetermined integer, said additional signal being utilized as a second receiver injection frequency by said receiver.

7. A frequency synthesizer according to claim 6 wherein said fixed divider means comprises serially connected divider portions which together produce said input to said phase-frequency comparator means, only one of said divider portions producing said second receiver injection frequency.

8. A frequency synthesizer, for use in a radio transceiver with a single offset and reference oscillator, comprising:

an electronically controllable frequency divider means which has a maximum input frequency $F_{inmax}$ at which it can operate at, said frequency divider means receiving an input signal at a frequency $F_{in}$ less than $F_{inmax}$ and producing an output signal which has a frequency corresponding to the frequency of the input signal $F_{in}$ divided by a predetermined integer, the frequency divider means receiving electrical control signals which determine the predetermined integer;

master crystal oscillator means producing an output signal having a stable operative frequency $F_{xtal}$ which is substantially above the frequency $F_{in}$;

voltage controlled oscillator (VCO) means providing an output signal having a frequency $F_{vco}$ substantially above the frequency $F_{in}$;

difference mixer means coupled to said VCO means for receiving a signal therefrom having a frequency no more than $F_{vco}$, and coupled to said crystal oscillator means for receiving a signal therefrom having a frequency no more than the frequency $F_{xtal}$, said mixer means providing at an output a signal having a frequency equal to the difference of the frequencies of the received signals, said mixer output coupled to said controllable divider means with said divider means receiving a signal having a frequency $F_{in}$ less than the frequency $F_{inmax}$ and no more than the frequency of the output signal of said mixer means;

said VCO means, difference mixer means and controllable divider means being part of a phase-frequency locked loop;

phase-frequency comparator means also being included in said phase-frequency locked loop and receiving an input from the output of the controllable divider means;

fixed divider means coupled to said master crystal oscillator for providing a signal having a frequency substantially less than $F_{xtal}$ as another input to said phase-frequency comparator means from said master crystal oscillator means;

said phase-frequency comparator means providing a difference output signal related to the phase-frequency difference between the output signal of the controllable divider means and the output signal of the fixed divider means; and low pass filter means which is part of said phase-frequency locked loop and receives said phase-frequency difference output signal and supplies a DC control input signal to said VCO means in response thereto, wherein said VCO output signal, in accordance with said controllable divider means receiving appropriate electrical control signals, determines at least a receiver and transmitter injection frequency signal for a radio transceiver, whereby only a single stable oscillator is required by the frequency synthesizer, no frequency multiplication stages in the phase-frequency locked loop are required, and an inexpensive controllable frequency divider means operable at a relatively low maximum frequency $F_{inmax}$ can be used.

9. A frequency synthesizer according to claim 8 wherein said VCO output signal is directly coupled as an input to said difference mixer means.

10. A frequency synthesizer according to claim 9 wherein said master oscillator output signal is directly coupled as an input to said difference mixer means.

11. A frequency synthesizer according to claim 10 wherein the output signal of said difference mixer means is directly coupled as an input to said controllable frequency divider means.

12. A frequency synthesizer according to claim 11 wherein said fixed divider means provides an additional output signal at a frequency equal to $F_{xtal}$ divided by a predetermined integer, said additional signal being utilized as a second receiver injection frequency by said receiver.

13. A frequency synthesizer according to claim 12 wherein said fixed divider means comprises serially connected divider portions which together produce said input to said phase-frequency comparator means, only one of said divider portions producing said second receiver injection frequency.

14. A frequency synthesizer according to claims 8, 11 or 13 which includes transmit filter means for receiving said VCO output signal and providing a signal at an output terminal having a frequency equal to $F_{VCO}$ multiplied by an integer, said signal at said transmit filter means output being utilized as said transmit injection frequency signal.

* * * * *